United States Patent
Shen et al.

(10) Patent No.: US 10,575,406 B1
(45) Date of Patent: Feb. 25, 2020

(54) METHOD OF MAKING FLEXIBLE CIRCUIT BOARD

(71) Applicants: Avary Holding (Shenzhen) Co., Limited, Shenzhen (CN); HongQiSheng Precision Electronics (QinHuangDao) Co., Ltd., Qinhuangdao (CN)

(72) Inventors: Fu-Yun Shen, Shenzhen (CN); Ming-Jaan Ho, New Taipei (TW); Hsiao-Ting Hsu, New Taipei (TW)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 0 days.

(21) Appl. No.: 16/147,485

(22) Filed: Sep. 28, 2018

(30) Foreign Application Priority Data

Aug. 23, 2018 (CN) .......................... 2018 1 0968814

(51) Int. Cl.
| | |
|---|---|
| *H05K 3/02* | (2006.01) |
| *H05K 1/18* | (2006.01) |
| *H05K 1/02* | (2006.01) |
| *H05K 3/46* | (2006.01) |
| *H05K 3/00* | (2006.01) |

(52) U.S. Cl.
CPC ............. *H05K 1/189* (2013.01); *H05K 1/028* (2013.01); *H05K 3/0017* (2013.01); *H05K 3/4635* (2013.01); *H05K 2201/012* (2013.01); *H05K 2201/015* (2013.01); *H05K 2201/0158* (2013.01); *H05K 2201/0162* (2013.01); *H05K 2201/0195* (2013.01); *Y10T 29/49155* (2015.01)

(58) Field of Classification Search
CPC ........... H01L 23/5385; Y10T 29/49165; Y10T 29/49155; Y10T 29/49117; Y10T 29/49156; Y10T 29/4921; Y10T 29/49124; Y10T 29/49146; Y10T 29/49167; H05K 3/4602; H05K 1/0298; H05K 1/115; H05K 3/0017; H05K 3/022
USPC ......... 29/847, 825, 829, 841, 846, 848, 852, 29/853
See application file for complete search history.

(56) References Cited

U.S. PATENT DOCUMENTS

| | | | |
|---|---|---|---|
| 8,796,410 B2* | 8/2014 | Sugo .................. | C08G 73/0638 528/35 |
| 9,485,859 B1* | 11/2016 | Hu ......................... | H05K 1/024 |
| 9,577,129 B1* | 2/2017 | Richards ............... | H01L 31/048 |
| 9,769,921 B2* | 9/2017 | Choi .................... | C23C 18/1637 |

* cited by examiner

*Primary Examiner* — Thiem D Phan
(74) *Attorney, Agent, or Firm* — ScienBiziP, P.C.

(57) ABSTRACT

A flexible circuit board includes a substrate including a base layer and a bonding layer formed on each of opposite sides of the base layer. Each of the two bonding layers is formed by coating a bonding solution and drying the bonding solution. The bonding solution is composed of an adhesive and a solvent. A viscosity of the adhesive is 5000 millipascal-seconds. The adhesive is composed of a precursor having a mass fraction of 35%-65%, carboxyl modified polyphenylene oxide having a mass fraction of 10%-15%, bisphenol-F-epoxy resin having a mass fraction of 10%-15%, a silane coupling agent having a mass fraction of 0%-1.5%, silica filler having a mass fraction of 5%-20%, and a flame retardant filler having a mass fraction of 10%-20%.

6 Claims, 3 Drawing Sheets

METHOD OF MAKING FLEXIBLE CIRCUIT BOARD

FIELD

The subject matter herein generally relates to flexible circuit boards, and more particularly to a flexible circuit board having low transmission loss and a method for making the flexible circuit board.

BACKGROUND

Material of a circuit board is an important consideration in making the circuit board. Circuit boards made of polyimide generally have a high dielectric loss factor (Df) and a high dielectric constant (Dk). Thus, it is difficult to satisfy requirements for high frequency signal transmission.

Therefore, there is room for improvement within the art.

BRIEF DESCRIPTION OF THE DRAWINGS

Implementations of the present disclosure will now be described, by way of example only, with reference to the attached figures.

DETAILED DESCRIPTION

Figure 1:
FIG. 1 is a cross-sectional view of an embodiment of a base layer.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

A method for making a flexible circuit board 100 is provided in the following steps.

FIG. 1 shows step S1. A base layer 10 is provided. The base layer 10 may be made of PI, FR4, or PEEK.

Figure 2:
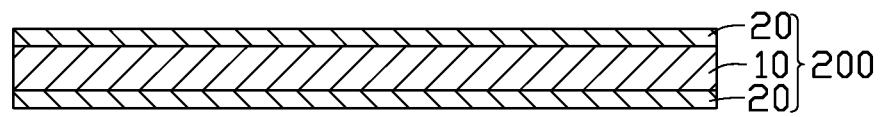
FIG. 2 is a cross-sectional view of the base layer having two bonding layers formed thereon.

FIG. 2 shows step S2. A bonding solution is applied on each of opposite surfaces of the base layer 10. The bonding solution is dried to form two corresponding bonding layers 20. The base layer 10 and the two bonding layers 20 cooperatively form a substrate 200. The bonding solution is dried at 100 degrees Celsius, and a time duration of drying the bonding solution is 5 minutes. The two bonding layers 20 adhere to the opposite surfaces of the base layer 10. A thickness of each bonding layer 20 is 1-3 micrometers.

Figure 3:
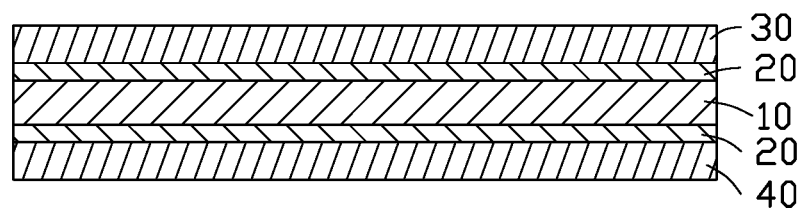
FIG. 3 is a cross-sectional view of a first copper layer and a second copper layer formed on the bonding layers.

FIG. 3 shows step S3. A first copper layer 30 is formed on a surface of one of the bonding layers 20 facing away from the base layer 10, and a second copper layer 40 is formed on a surface of the other one of the bonding layers 20 facing away from the base layer 10. Forming the first copper layer 30 and the second copper layer 40 on each the surfaces of the first and the second bonding layers 20 is solidified at 170 degrees Celsius, a time duration of solidifying the first copper layer 30 and the second copper layer 40 is 30 minutes, and a pressure value of forming the first copper layer 30 and the second copper layer 40 is 5 pascals.

Figure 4:
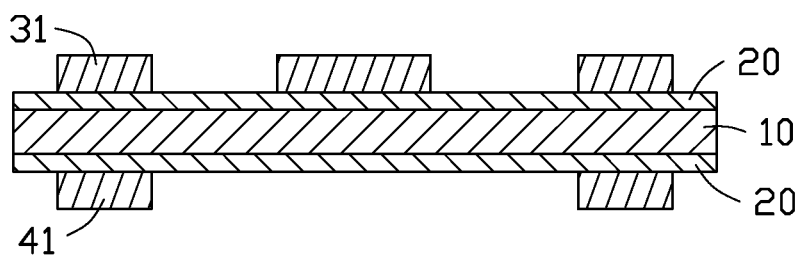
FIG. 4 is a cross-sectional view of the first copper layer and the second copper layer etched to form a first signal line layer and a second signal line layer.

FIG. 4 shows step S4. The first copper layer 30 is etched to form a first signal line layer 31, and the second copper layer 40 is etched to form a second signal line layer 41.

Figure 5:
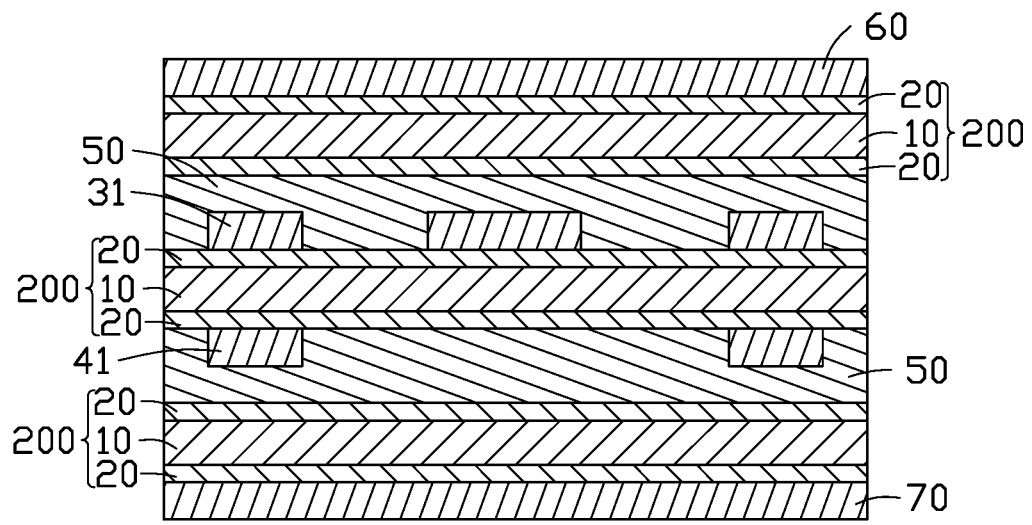
FIG. 5 is a cross-sectional view of two insulating layers, two additional substrates, a third copper layer, and a fourth copper layer laminated onto the first signal line layer and the second signal line layer.

FIG. 5 shows step S5. An insulating layer 50 is formed on a surface of each of the first signal line layer 31 and the second signal line layer 41. The insulating layer 50 is formed over the surfaces of the first signal line layer 31 and the second signal line layer 41 and fills in the etched portions of the first signal line layer 31 and the second signal line layer 41 over the corresponding bonding layers 20. Material of the insulating layers 50 is selected from flexible insulating material, such as epoxy resin. In one embodiment, the insulating layer 50 is partially solidified resin applied over the surfaces of the first signal line layer 31 and the second signal line layer 41 and then pressed to fill in the etched portions of the first signal line layer 31 and the second signal line layer 41 over the corresponding bonding layers 20.

FIG. 5 shows step S6. Steps S1 and S2 are repeated to form two additional substrates 200. Each additional substrate 200 is laminated onto the surface of the corresponding insulating layer 50.

Figure 6:
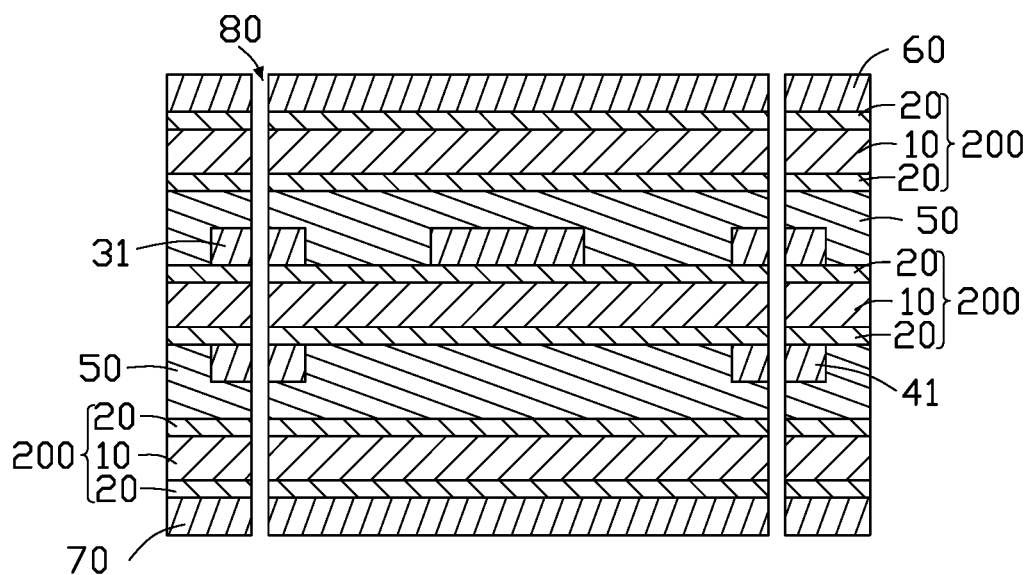
FIG. 6 is a cross-sectional view of a through hole defined through the substrates, the first copper layer, the second copper layer, the insulating layers, the third copper layer, and the fourth copper layer.

FIGS. 5-6 show step S7. A third copper layer 60 is formed on a surface of the bonding layer 20 of a first one of the other substrates 200 facing away from a first one of the insulating layers 50, and a fourth copper layer 70 is formed on a surface of the bonding layer 20 of a second one of the other substrates 200 facing away from a second one of the insulating layers 50. At least one through hole 80 is defined through the substrates 200, the first signal line layer 31, the second signal line layer 41, the two insulating layers 50, the third copper layer 60, and the fourth copper layer 70.

Figure 7:
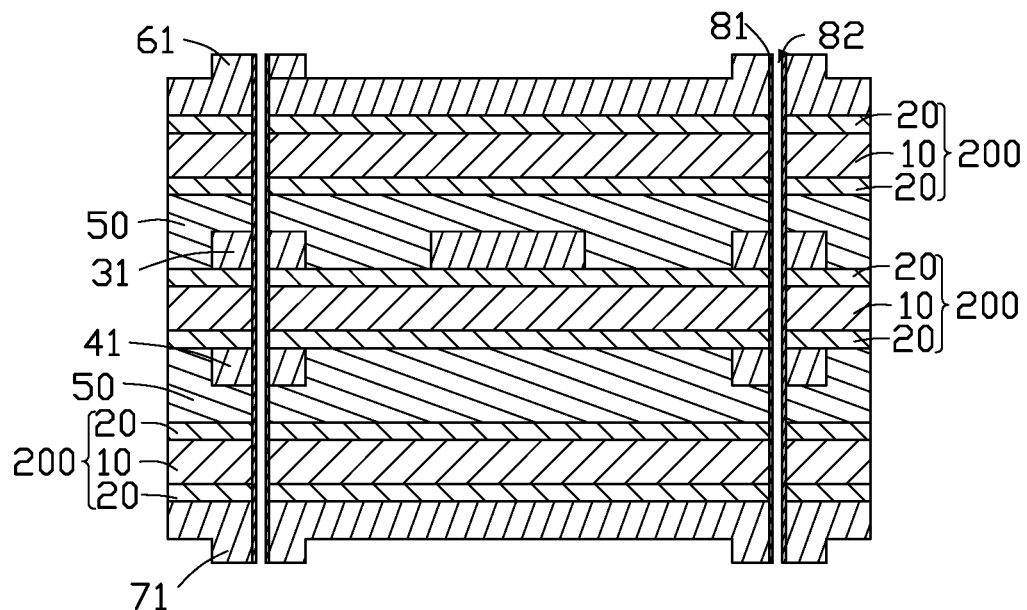
FIG. 7 is a cross-sectional view of an inner wall of the through hole electroplated to form a conductive via.

FIG. 7 shows step S8. An inner wall of the through hole 80 is electroplated to form an electroplating layer 81 on the inner wall of the through hole 80, thereby forming a conductive via 82 for electrically interconnecting the first signal line layer 31 and the second signal line layer 41. In one embodiment, material of the electroplating layer 81 is copper. In other embodiments, the electroplating layer 81 may be formed from other materials.

FIG. 7 shows step S9. The third copper layer 60 is etched to form a first ground layer 61, and the fourth copper layer 70 is etched to form a second ground layer 71.

Figure 8:
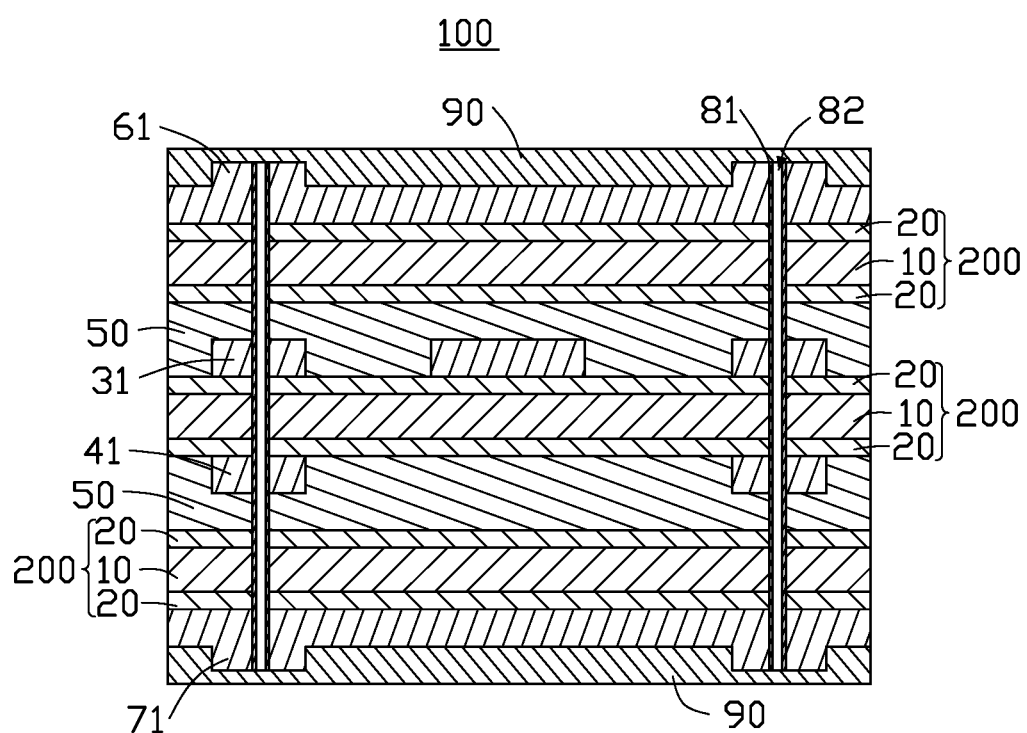
FIG. 8 is a cross-sectional view of a protective layer formed on a first ground layer and a second ground layer.

FIG. 8 shows step S10. A cover film 90 is formed on a surface of each of the first ground layer 61 and the second ground layer 71, thereby completing formation of the flexible circuit board 100. The cover film 90 protects the first ground layer 61 and the second ground layer 71.

After step S6, additional signal line layers may be formed over the first signal line layer 31 and the second signal line layer 41 according to requirements.

Alternatively, steps S6-S10 may be omitted.

In one embodiment, the bonding solution is composed of an adhesive and a solvent. A bonding strength of the adhesive is 5000 millipascal-seconds.

The adhesive is composed of a precursor having a mass fraction of 35%-65%, carboxyl modified polyphenylene oxide having a mass fraction of 10%-15%, bisphenol-F-epoxy resin having a mass fraction of 10%-15%, a silane coupling agent having a mass fraction of 0%-1.5%, silica filler having a mass fraction of 5%-20%, and a flame retardant filler having a mass fraction of 10%-20%.

The adhesive precursor is selected from one or more of fluoroalkyl-modified polyamic acid and silsesquioxane-modified polyamic acid. Using an adhesive precursor made of material similar to the material of the base layer 10 enhances the bonding strength of the bonding layer 20 to the base layer 10.

The carboxyl modified polyphenylene oxide enhances a relative dielectric constant (Dk) of the bonding layer 20.

The bisphenol-F-epoxy resin reduces fragility of the carboxyl modified polyphenylene oxide and reduces fragility of the bonding layer 20.

The silane coupling agent is selected from one or more of N-β-γ-aminopropyltrimethoxysilane, glycidyl methoxypropyl trimethoxysilane, methylallyl propyl trimethoxysilane, thiopropyl tri-methyl(ethyl) oxysilane. The silane coupling agent enhances adhesiveness of the bonding layer 20 to the base layer 10.

The silica filler enhances dielectricity of the bonding layer 20 and controls expansion and shrinkage of the bonding layer 20.

The flame retardant filler is selected from one or more of hexaphenoxycyclotriphosphazene and melamine polyphosphate. The flame retardant filler enhances flame retardation of the bonding layer 20.

The solvent is selected from one or more of carbitol acetate, cyclohexanone, and methyl cyclohexane. The solvent dissolves the adhesive to form the bonding solution.

A method of making the bonding solution is provided as follows.

The adhesive is placed within a container. A predetermined volume of solvent is dispensed within the container and stirred to form the bonding solution having a bonding strength of 5000 millipascal-seconds.

A first embodiment of making the bonding solution is provided as follows.

A solvent selected from carbitol acetate is provided. 52.8 grams (g) of fluoroalkyl-modified polyamic acid, 13.2 g of silsesquioxane-modified polyamic acid, 11.5 g of carboxyl modified polyphenylene oxide, 10.3 g of bisphenol-F-epoxy resin, 0.7 g of N-β-γ-aminopropyltrimethoxysilane, 9.5 g of silica filler, and 15 g of hexaphenoxycyclotriphosphazene are placed in a container. A predetermined volume of carbitol acetate is dispensed into the container and mixed to form the bonding solution.

A second embodiment of making the bonding solution is provided as follows.

A solvent selected from carbitol acetate is provided. 39.6 g of fluoroalkyl-modified polyamic acid, 26.4 g of silsesquioxane-modified polyamic acid, 11.3 g of carboxyl modified polyphenylene oxide, 10.3 g of bisphenol-F-epoxy resin, 0.7 g of N-β-γ-aminopropyltrimethoxysilane, 9.5 g of silica filler, and 15 g of hexaphenoxycyclotriphosphazene are placed in a container. A predetermined volume of carbitol acetate is dispensed into the container and mixed to form the bonding solution.

A third embodiment of making the bonding solution is provided as follows.

A solvent selected from carbitol acetate is provided. 33 g of fluoroalkyl-modified polyamic acid, 33 g of silsesquioxane-modified polyamic acid, 11.1 g of carboxyl modified polyphenylene oxide, 10.3 g of bisphenol-F-epoxy resin, 0.7 g of N-β-γ-aminopropyltrimethoxysilane, 9.5 g of silica filler, and 15 g of hexaphenoxycyclotriphosphazene are placed in a container. A predetermined volume of carbitol acetate is dispensed into the container and mixed to form the bonding solution.

A fourth embodiment of making the bonding solution is provided as follows.

A solvent selected from carbitol acetate is provided. 65 g of fluoroalkyl-modified polyamic acid, 11.5 g of carboxyl modified polyphenylene oxide, 10.3 g of bisphenol-F-epoxy resin, 0.7 g of N-β-γ-aminopropyltrimethoxysilane, 9.5 g of silica filler, and 15 g of hexaphenoxycyclotriphosphazene are placed in a container. A predetermined volume of carbitol acetate is dispensed into the container and mixed to form the bonding solution.

A fifth embodiment of making the bonding solution is provided as follows.

A solvent selected from carbitol acetate is provided. 14 g of fluoroalkyl-modified polyamic acid, 48 g of silsesquioxane-modified polyamic acid, 15 g of carboxyl modified polyphenylene oxide, 10.3 g of bisphenol-F-epoxy resin, 0.7 g of N-β-γ-aminopropyltrimethoxysilane, 9.5 g of silica filler, and 15 g of hexaphenoxycyclotriphosphazene are placed in a container. A predetermined volume of carbitol acetate is dispensed into the container and mixed to form the bonding solution.

The bonding layer 20 formed from the bonding solution provided in the first-fifth embodiments has a peel strength of 1.1 kgf/cm, 1.4 kgf/cm, 1.5 kgf/cm, 1.1 kgf/cm, and 1.4 kgf/cm, respectively.

The bonding layer 20 formed from the bonding solution provided in the first-fifth embodiments has a solder thermal resistance of 320 degrees C., 300 degrees C., 300 degrees C., 300 degrees C., and 320 degrees C., respectively.

The bonding layer 20 formed from the bonding solution provided in the first-fifth embodiments has a dielectric constant (Dk) of 2.5, 2.6, 2.6, 2.6, and 2.9, respectively.

The bonding layer 20 formed from the bonding solution provided in the first-fifth embodiments has a dielectric loss factor (Df) of 0.003, 0.005, 0.005, 0.006, and 0.005, respectively.

FIGS. 5-8 show the flexible circuit board 100 including the base layer 10, the two bonding layers 20, the first signal line layer 31, the second signal line layer 41, and the two insulating layers 50. The base layer 10 is made of polyimide, fiberglass, epoxy resin, or polyether ether ketone. The two bonding layers 20 are formed on opposite surfaces of the base layer 10. The bonding layers 20 are formed by applying the bonding solution onto the surfaces of the base layer 10 and drying the bonding solution. A thickness of the bonding layer 20 is 1-3 micrometers. The base layer 10 and the two bonding layers 20 cooperatively form the substrate 200.

The bonding solution is composed of an adhesive and a solvent. A bonding strength of the adhesive is 5000 millipascal-seconds.

The adhesive is composed of a precursor having a mass fraction of 35%-65%, carboxyl modified polyphenylene oxide having a mass fraction of 10%-15%, bisphenol-F-epoxy resin having a mass fraction of 10%-15%, a silane coupling agent having a mass fraction of 0%-1.5%, silica filler having a mass fraction of 5%-20%, and a flame retardant filler having a mass fraction of 10%-20%.

The adhesive precursor is selected from one or more of fluoroalkyl-modified polyamic acid and silsesquioxane-modified polyamic acid. The precursor made of material similar to the material of the base layer 10 enhances the bonding strength of the bonding layer 20 to the base layer 10.

The carboxyl modified polyphenylene oxide enhances a relative dielectric constant (Dk) of the bonding layer 20.

The bisphenol-F-epoxy resin reduces fragility of the carboxyl modified polyphenylene oxide and reduces fragility of the bonding layer 20.

The silane coupling agent is selected from one or more of N-β-γ-aminopropyltrimethoxysilane, glycidyl methoxypropyl trimethoxysilane, methylallyl propyl trimethoxysilane, thiopropyl tri-methyl(ethyl) oxysilane. The silane coupling agent enhances adhesiveness of the bonding layer 20 to the base layer 10.

The silica filler enhances dielectricity of the bonding layer 20 and controls expansion and shrinkage of the bonding layer 20.

The flame retardant filler is selected from one or more of hexaphenoxycyclotriphosphazene and melamine polyphosphate. The flame retardant filler enhances flame retardation of the bonding layer 20.

The solvent is selected from one or more of carbitol acetate, cyclohexanone, and methyl cyclohexane. The solvent dissolves the adhesive to form the bonding solution.

The first signal line layer 31 is formed on the corresponding bonding layer 20, and the second signal line layer 41 is formed on the corresponding bonding layer 20. The two insulating layer 50 are formed over the first signal line layer 31 and the second signal line layer 41 and fill in the exposed portions of the first signal line layer 31 and the second signal line layer 41.

A first one of two additional substrates 200 is laminated onto the surface of one of the corresponding insulating layers 50, and a second one of the two additional substrates 200 is laminated onto the surface of a second one of the corresponding insulating layers 50. A first ground layer 61 is formed on a surface of the bonding layer 20 of the first one of the additional substrates 200 facing away from a first one of the insulating layers 50, and a second ground layer 71 is formed on a surface of the bonding layer 20 of the second one of the additional substrates 200 facing away from a second one of the insulating layers 50. The substrates 200, the first signal line layer 31, the second signal line layer 41, the two insulating layers 50, the third copper layer 60, and the fourth copper layer 70 are electrically interconnected by at least one conductive via 82 formed therethrough.

A cover film 90 is formed on a surface of each of the first ground layer 61 and the second ground layer 71, thereby completing formation of the flexible circuit board 100.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A method of making a flexible circuit board, the method comprising:
   providing a base layer;
   coating a bonding solution on both of opposite sides of the base layer and drying the bonding solution to form two corresponding bonding layers, the base layer and the two bonding layers cooperatively forming a substrate;
   forming a first copper layer on a surface of a first one of the bonding layers facing away from the base layer, and forming a second copper layer on a surface of a second one of the bonding layers facing away from the base layer;
   etching the first copper layer to form a first signal line layer, and etching the second copper layer to form a second signal line layer; and
   forming an insulating layer on a surface of each of the first signal line layer and the second signal line layer;
   wherein forming the first copper layer and the second copper layer on each the surfaces of the first and the second bonding layers is solidified at 170 degrees Celsius, a time duration of solidifying the first copper layer and the second copper layer is 30 minutes, and a pressure value of forming the first copper layer and the second copper layer is 5 pascals.

2. The method of claim 1, wherein the bonding solution is dried at 100 degrees Celsius, and a time duration of drying the bonding solution is 5 minutes.

3. The method of claim 1, further comprising:
   laminating, on a surface of each insulating layer, an additional substrate formed by the process of claim 1;
   forming a third copper layer on a surface of the bonding layer of a first one of the other substrates facing away from a first one of the insulating layers, and forming a fourth copper layer on a surface of the bonding layer of a second one of the other substrates facing away from a second one of the insulating layers;
   defining at least one through hole through the three substrates, the first signal line layer, the second signal line layer, the two insulating layers, the third copper layer, and the fourth copper layer;
   electroplating an inner wall of the at least one through hole to form an electroplating layer on the inner wall of the at least one through hole, thereby forming a conductive via; and
   etching the third copper layer to form a first ground layer, and etching the fourth copper layer to form a second ground layer.

4. The method of claim 3, further comprising:
   forming a cover film on a surface of each of the first ground layer and the second ground layer.

5. The method of claim 1, wherein the bonding solution is composed of an adhesive and a solvent, and a viscosity of the adhesive is 5000 millipascal-seconds.

6. The method of claim 1, wherein the base layer is made of PI, FR4, or PEEK.

* * * * *